United States Patent
Yoon et al.

(10) Patent No.: US 10,314,159 B2
(45) Date of Patent: Jun. 4, 2019

(54) PRINTED CIRCUIT BOARD HEAT DISSIPATION SYSTEM USING HIGHLY CONDUCTIVE HEAT DISSIPATION PAD

(71) Applicant: LG Chem, Ltd., Seoul (KR)

(72) Inventors: Seung Kyu Yoon, Daejeon (KR); Jun Young Bang, Daejeon (KR)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 15/577,866

(22) PCT Filed: Dec. 8, 2016

(86) PCT No.: PCT/KR2016/014383
§ 371 (c)(1),
(2) Date: Nov. 29, 2017

(87) PCT Pub. No.: WO2017/105034
PCT Pub. Date: Jun. 22, 2017

(65) Prior Publication Data
US 2018/0177038 A1    Jun. 21, 2018

(30) Foreign Application Priority Data
Dec. 18, 2015  (KR) .................. 10-2015-0182274

(51) Int. Cl.
*H02J 7/00*     (2006.01)
*H02J 7/02*     (2016.01)
(Continued)

(52) U.S. Cl.
CPC ......... *H05K 1/0203* (2013.01); *H01L 23/373* (2013.01); *H02J 7/02* (2013.01);
(Continued)

(58) Field of Classification Search
CPC .... G06F 1/181–1/182; H05K 7/20218–20381; H05K 7/20409–20418;
(Continued)

(56) References Cited

U.S. PATENT DOCUMENTS 5,594,626 A * 1/1997 Rostoker ............. G03F 7/70433
257/666
5,631,497 A * 5/1997 Miyano ............... H01L 23/3672
257/668

(Continued)

FOREIGN PATENT DOCUMENTS

EP         0974249 A1    1/2000
JP       2003115564 A    4/2003
(Continued)

OTHER PUBLICATIONS

Extended European Search Report and Written Opinion for EP Application No. 16875976.9, dated Jul. 13, 2018.
(Continued)

*Primary Examiner* — Robert J Hoffberg
*Assistant Examiner* — Razmeen Gafur
(74) *Attorney, Agent, or Firm* — Lerner, David, Littenberg, Krumholz & Mentlik, LLP

(57) ABSTRACT

The present invention presents a printed circuit board heat dissipation system using a highly conductive heat dissipation pad, the heat dissipation system comprising: one or more electronic components mounted on a printed circuit board; the printed circuit board having formed thereon a conductive pattern providing current paths between the mounted one or more electronic components; and a highly conductive heat dissipation pad discharging heat generated due to the current flowing in the conductive pattern of the printed circuit board.

7 Claims, 2 Drawing Sheets

(51) Int. Cl.
| | |
|---|---|
| *H02J 7/04* | (2006.01) |
| *H05K 1/11* | (2006.01) |
| *H05K 1/18* | (2006.01) |
| *H05K 3/24* | (2006.01) |
| *H01L 23/373* | (2006.01) |
| *H05K 1/02* | (2006.01) |
| *H05K 7/20* | (2006.01) |

(52) U.S. Cl.
CPC .............. *H02J 7/04* (2013.01); *H05K 1/0209* (2013.01); *H05K 1/11* (2013.01); *H05K 7/20* (2013.01); *H02J 7/0068* (2013.01); *H05K 1/0265* (2013.01); *H05K 1/181* (2013.01); *H05K 3/24* (2013.01); *H05K 2201/066* (2013.01); *H05K 2201/10166* (2013.01)

(58) Field of Classification Search
CPC ..... H05K 7/20009–202; H05K 1/0203; H05K 1/0209; H05K 1/11; H05K 1/0265; H05K 1/181; H05K 2201/066; H05K 2201/10166; H05K 7/20; H05K 7/0068; H05K 3/24; H01L 23/367–3677; H01L 23/473; H01L 23/46–23/467; H01L 23/36; H01L 23/38; H01L 23/40; H01L 23/3672; H01L 23/3675; H01L 23/3677; H01L 23/3732; H01L 23/3733; H01L 23/3735; H01L 23/3736; H01L 23/3737; H01L 23/3738; H02J 7/02; H02J 7/04; H02J 7/0068
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | | |
|---|---|---|---|---|---|
| 5,978,223 | A * | 11/1999 | Hamilton | ............. | H01L 23/4093 165/185 |
| 6,062,903 | A | 5/2000 | Hawes et al. | | |
| 6,713,854 | B1 * | 3/2004 | Kledzik | ................. | H05K 1/141 174/252 |
| 7,816,784 | B2 * | 10/2010 | Son | ....................... | H01L 21/565 257/675 |
| 7,893,546 | B2 * | 2/2011 | Zhao | ....................... | H01L 23/24 257/707 |
| 8,153,473 | B2 * | 4/2012 | Lotfi | ................. | H01L 23/49589 257/E21.505 |
| 8,266,793 | B2 * | 9/2012 | Lotfi | ..................... | H01L 23/495 29/831 |
| 8,824,146 | B2 * | 9/2014 | Brok | ...................... | H01L 23/467 165/80.2 |
| 9,247,633 | B2 * | 1/2016 | Hirai | ....................... | H05K 7/06 |
| 9,984,950 | B2 * | 5/2018 | Kim | ..................... | H01L 23/3675 |
| 2003/0016502 | A1 * | 1/2003 | Yamada | ................ | H01L 23/049 361/705 |
| 2003/0085455 | A1 * | 5/2003 | Roeters | ................. | H01L 23/367 257/686 |
| 2004/0125573 | A1 * | 7/2004 | Joshi | ...................... | H05K 1/141 361/723 |
| 2005/0024838 | A1 * | 2/2005 | Maxwell | ............. | H01L 23/5385 361/782 |
| 2007/0258215 | A1 * | 11/2007 | Kwon | ..................... | H01L 23/24 361/704 |
| 2008/0107867 | A1 * | 5/2008 | Miekka | ................ | H05K 1/0203 428/141 |
| 2008/0136015 | A1 * | 6/2008 | Lee | ........................ | H01L 23/142 257/712 |
| 2008/0170035 | A1 | 7/2008 | Uotani | | |
| 2009/0139690 | A1 * | 6/2009 | Maerz | ................... | H01L 23/367 165/80.2 |
| 2009/0147440 | A1 * | 6/2009 | Cygan | .................... | H01G 4/232 361/306.3 |
| 2009/0161318 | A1 * | 6/2009 | Sanderson | ........... | H05K 1/0203 361/709 |
| 2009/0201643 | A1 * | 8/2009 | Shi | ........................ | H01L 23/473 361/699 |
| 2009/0237889 | A1 * | 9/2009 | Swanson | ............... | H05K 1/0206 361/709 |
| 2011/0067902 | A1 | 3/2011 | Shin et al. | | |
| 2011/0284989 | A1 * | 11/2011 | Umeno | ................. | H01L 23/495 257/531 |
| 2013/0214418 | A1 * | 8/2013 | Yang | ...................... | H01L 24/24 257/762 |
| 2013/0343000 | A1 * | 12/2013 | Shi | ...................... | H01L 23/3677 361/717 |
| 2014/0063744 | A1 * | 3/2014 | Lopez | ................. | H01L 23/4334 361/719 |
| 2014/0103505 | A1 * | 4/2014 | Zhao | ....................... | H01L 24/97 257/675 |
| 2014/0160684 | A1 * | 6/2014 | Wittenberg | .......... | H05K 1/0203 361/719 |
| 2014/0338964 | A1 | 11/2014 | Berglund | | |
| 2015/0064848 | A1 * | 3/2015 | Crowder | ............... | H01L 23/047 438/122 |
| 2015/0109738 | A1 * | 4/2015 | Yamada | ............... | H01L 23/4334 361/717 |
| 2015/0118391 | A1 * | 4/2015 | Kilhenny | ............. | H05K 3/4661 427/97.2 |
| 2015/0255380 | A1 * | 9/2015 | Chen | ................. | H01L 23/49568 361/707 |
| 2015/0342084 | A1 * | 11/2015 | Dorenkamp | ......... | H05K 7/2089 361/720 |
| 2016/0037674 | A1 * | 2/2016 | Yamanaka | ......... | H02K 11/0073 310/68 R |
| 2016/0143132 | A1 * | 5/2016 | Min | ..................... | H05K 1/0207 361/699 |
| 2016/0261009 | A1 * | 9/2016 | Byun | ...................... | H01M 2/04 |
| 2016/0366760 | A1 * | 12/2016 | Lee | ....................... | H05K 1/0283 |
| 2017/0033055 | A1 * | 2/2017 | Watanabe | ......... | H01L 23/49548 |
| 2017/0133355 | A1 * | 5/2017 | Chen | ..................... | H01L 23/495 |
| 2017/0302191 | A1 * | 10/2017 | Nakatsu | ................. | B60L 11/14 |
| 2018/0122555 | A1 * | 5/2018 | Kim | ..................... | H01F 27/2804 |

FOREIGN PATENT DOCUMENTS

| | | | |
|---|---|---|---|
| JP | 2005332840 | A | 12/2005 |
| JP | 2006210409 | A | 8/2006 |
| JP | 2009129841 | A | 6/2009 |
| JP | 2011100848 | A | 5/2011 |
| JP | 2013161812 | A | 8/2013 |
| KR | 20070086703 | A | 8/2007 |
| KR | 100939760 | B1 | 2/2010 |
| KR | 20100109332 | A | 10/2010 |
| KR | 20120009258 | A | 2/2012 |
| KR | 101434224 | B1 | 9/2014 |

OTHER PUBLICATIONS

Search report from International Application No. PCT/KR2016/014383, dated Feb. 20, 2017.

* cited by examiner

PRINTED CIRCUIT BOARD HEAT DISSIPATION SYSTEM USING HIGHLY CONDUCTIVE HEAT DISSIPATION PAD

CROSS-REFERENCE TO RELATED APPLICATIONS

The present application is a national phase entry under 35 U.S.C. § 371 of International Application No. PCT/KR2016/014383 filed Dec. 8, 2016, which claims priority from Korean Application No. 10-2015-0182274 filed Dec. 18, 2015, all of which are incorporated herein by reference.

TECHNICAL FIELD

The present disclosure relates to a heat-dissipating system for a printed circuit board using a high conductance heat-dissipating pad, and more particularly, to a heat-dissipating system for a printed circuit board using a high conductance heat-dissipating pad, the system being capable of reducing heat generated on a printed circuit board and efficiently dissipating the generated heat.

BACKGROUND ART

In general, printed circuit boards, in which connection of components using respective wires in related arts is excluded and electrical paths of circuits are formed by printing conductive patterns on the boards, are indispensably required for integrating circuits and have been widely used recently in all electronic and electrical circuits.

When elements are mounted on a printed circuit board and a power is supplied, heat is inevitably generated due to resistive components disturbing the current flow between conductive patterns and elements on the printed circuit board. When heat is generated, a case occurs in which elements, such as a microprocessor, an FET, and a regulator, are sensitive to heat and malfunction due to the heat. In particular, due to active technical development of surface mount devices, technology has been developed into a type in which a lot of elements are mounted in one printed circuit board, and a phenomenon in which heat generated in any one component affects other components may also occur.

As such, in order to address the problem in that heat is generated on a printed circuit board, various techniques have been actively studied also in related arts to dissipate heat, and a separate configuration such as a heat sink or cooler has been used to solve the heat generation problem.

In addition, when a charging/discharging FET is mounted on a printed circuit board, in order to solve the heat generation problem in related arts, a separate heat dissipating plate is installed close to the FET to prevent the FET to be overheated. In this case, due to a limit in the sizes of the charging/discharging FET and the heat dissipating plate, it is difficult to manufacture a battery pack in a small size.

Accordingly, in order to solve the heat generation problem, a technique, in which heat is less generated when current flows, the generated heat is dissipated to the outside, and a battery pack may be manufactured in a small size, is required.

DISCLOSURE OF THE INVENTION

Technical Problem

The present disclosure provides a heat-dissipating system which is for a printed circuit board and allows current flowing on the printed circuit board to flow through a place with a smaller resistance to thereby reduce heat generation and efficiently dissipate the heat generated on the printed circuit board.

The present disclosure also provides a heat-dissipating system which is for a battery charging/discharging circuit and in which a heat-dissipating system is configured so that a battery pack may be manufactured in a small size.

Technical Solution

In accordance with an exemplary embodiment, a heat-dissipating system using a high-conductance heat-dissipating pad, includes: one or more electronic components mounted on a printed circuit board; a printed circuit board on which a conductive pattern providing a current path between the one or more electronic components is formed; and a high-conductance heat-dissipating pad dissipating heat generated due to current flowing through the conductive pattern of the printed circuit board.

The high-conductance heat-dissipating pad may include a lead part formed of a material having an electrical conductivity greater than that of the conductive pattern of the printed circuit board, and the entire or a predetermined section of the lead part may contacts the conductive pattern such that current having flown through the conductive pattern flows through the lead part.

The lead part which contacts the conductive pattern may contact both ends of a predetermined section of the conductive pattern through which current flows.

In accordance with another exemplary embodiment, a heat dissipating system of a battery charging/discharging circuit dissipates heat of a printed circuit board constituting a charging/discharging circuit and the heat dissipating system includes: a printed circuit board comprising a conductive pattern providing a path through which charging/discharging current flows; a charging/discharging FET mounted on the printed circuit board; and a high-conductance heat dissipating pad comprising a lead part electrically contacting the conductive pattern, wherein the lead part is formed of a material having an electrical conductivity greater than that of the conductive pattern.

Both ends or the entire surface of the lead part may contact a predetermined section through which current of the conductive pattern flows, and the lead part may provide an alternative path such that the current flows in a predetermined section, through which the current flows, not through the conductive pattern but through lead part.

The lead part may include: a first lead part electrically contacting a conductive pattern through which charging current flows; and a second lead part contacting a conductive pattern through which discharging current flows, wherein the first lead part and the second lead part may be formed on one and the other sides of a lower surface of a body of the high-conductance heat dissipating pad at respective positions facing each other The charging/discharging FET may have leads formed in right-angle shapes and may be mounted such that the body of the FET is horizontal to the printed circuit board.

Advantageous Effects

In accordance with exemplary embodiments, a heat-dissipating system using a high-conductance heat-dissipating pad reduces heat generation of a printed circuit board and dissipates the generated heat to the outside. Thus, heat dissipation may be efficiently performed.

MODE FOR CARRYING OUT THE INVENTION

Figure 1:
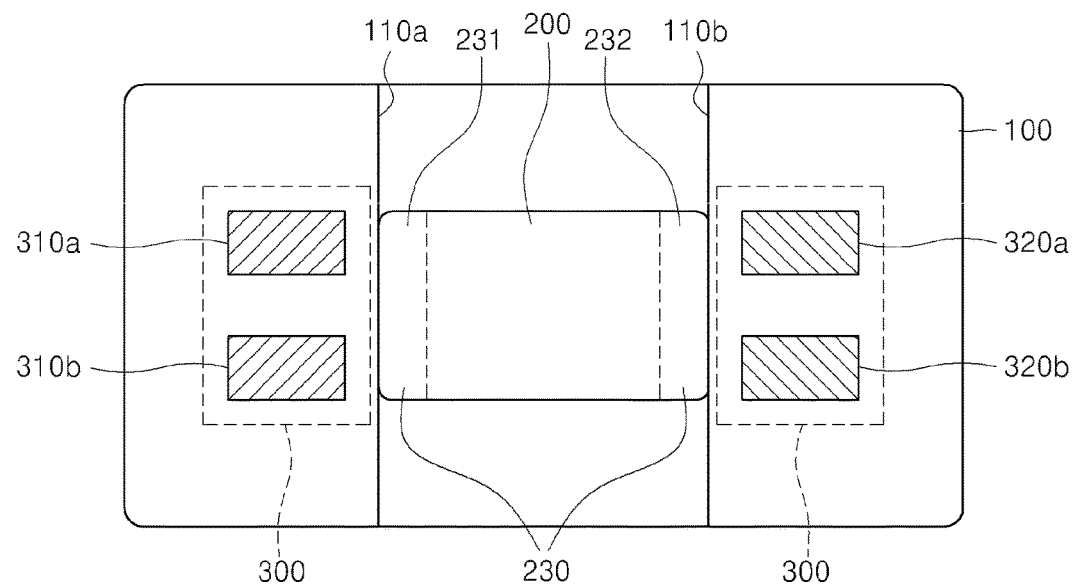
FIG. 1 is a top plan view of a heat-dissipating system for a printed circuit board using a high-conductance heat-dissipating pad in accordance with an exemplary embodiment.

Hereinafter, exemplary embodiments will be described in detail with reference to contents illustrated in accompanying drawings. However, the present disclosure should not be construed as limited to the exemplary embodiments. Rather, these embodiments are provided so that this disclosure will be thorough and complete, and will fully convey the scope of the present invention to those skilled in the art.

1. 1. Example of Heat-Dissipating System for Printed Circuit Board Using High-Conductance Heat-Dissipating Pad in Accordance with an Exemplary Embodiment A heat-dissipating system in accordance with an exemplary embodiment is configured such that an FET 300 which switches charging/discharging current to control the charge/discharge of a battery pack is mounted on a printed circuit board 100 to reduce heat generated while the charging/discharging current flows, and a high-conductance heat-dissipating pad 200 which efficiently dissipates the generated heat is mounted on the printed circuit board 200.

The heat-dissipating system of the present disclosure is configured such that the high-conductance heat-dissipating pad 200 is mounted on the printed circuit board 100 on which the FET 300 is mounted, and a lead part 230 of the high-conductance heat-dissipating pad 200 electrically contacts a predetermined section of a conductive pattern 110 on the printed circuit board 100.

Figure 2:
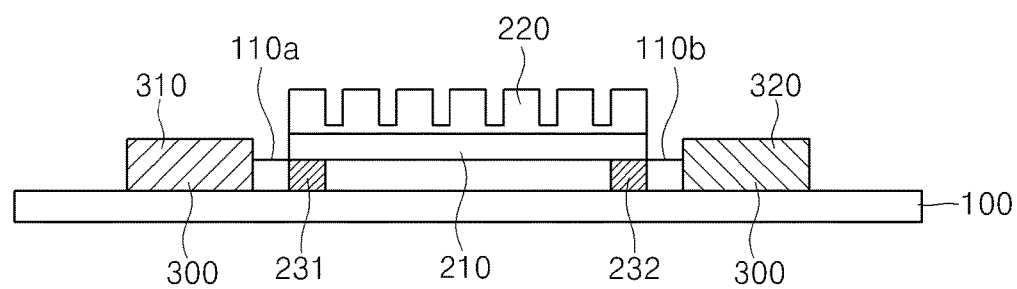
FIG. 2 is a front view of a heat-dissipating system for a printed circuit board using a high-conductance heat-dissipating pad in accordance with an exemplary embodiment.

To this end, the present disclosure is configured to include the printed circuit board 100, the high-conductance heat-dissipating pad 200, and the FET 300.
Hereinafter, with reference to FIGS. 1, 2, and 3, each configuration will be described in detail.

In general, in the printed circuit board 100, an electrical path is formed by printing the conductive pattern 110 on the board such that current may flow.

When an electronic component is mounted on the printed circuit board 100, current flows through the conductive pattern 110, and heat is generated due to resistive components disturbing the current flow.

However, when heat is generated, since the electronic component mounted on the printed circuit board may malfunction, heat generation should be prevented and the generated heat should be dissipated.

The high-conductance heat-dissipating pad 200 is mounted on the printed circuit board 100 and functions to dissipate heat on the printed circuit board to the outside.
In addition, the high-conductance heat-dissipating pad 200, which has a lead part 230 formed of a material having an electrical conductivity greater than that of the conductive pattern 110, functions to allow current to flow through a lead part 230 having a greater electrical conductivity in a contacted predetermined region after the lead part 230 is brought into contact with both ends of the predetermined region of the conductive pattern 110, and thus allows heat to be less generated than that generated when current flows through the conductive pattern 110.

In addition, the heat generated in the lead part 230 is dissipated to the outside through a heat dissipating part 220.

To this end, the high-conductance heat-dissipating pad 200 is configured to include a body 210, a heat-dissipating part 220, and a lead part 230.

Figure 3:
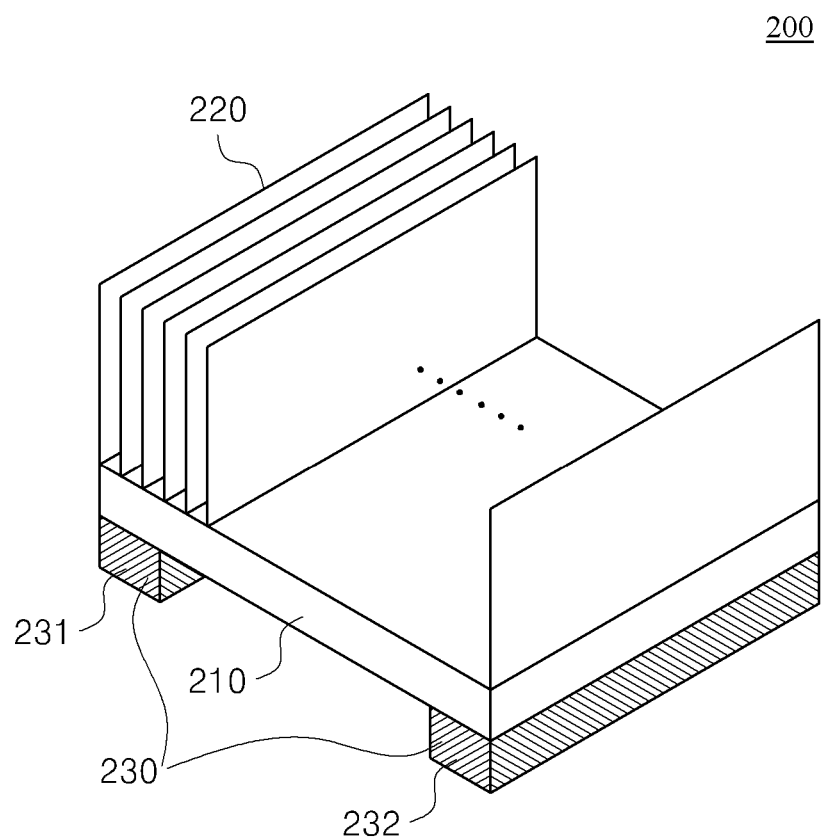
FIG. 3 is a configuration view of a high-conductance heat-dissipating pad.

Hereinafter, referring to FIG. 3, more detailed description will be provided.

The body 210 of the high-conductance heat-dissipating pad 200 has predetermined thickness and area, allows the heat-dissipating part 220 to be in contact therewith and positioned thereon, allows a lead part 230 to be in contact therewith and positioned thereon, and functions to connect these to be configured as one heat dissipating pad.

The heat dissipating part 220 is positioned on the body 210, has a comb structure, and functions to dissipate heat, which is received from the body 210 and is on the printed circuit board 100, to the outside.

In addition, the heat dissipating part 220 functions to immediately dissipate the heat generated when current flows through the lead part 230 and thereby prevent the temperature on the printed circuit board 100 from rising.

The lead part 230 is positioned under the body 210 and includes a first lead part 231 and a second lead part 232.

The lead part 230 is configured to have a predetermined thickness at an end portion in one direction under the body 210 and a length as long as the length of the body in the one direction, and the first lead part 231 and the second lead part 232 are positioned to face each other on one and the other sides of the end portion of the lower surface of the body 210 in the one direction.

Here, the one direction of the body 210 means a horizontal side or a vertical side of the body 210.

Meanwhile, the lead part 230 is formed of a material having an electrical conductivity greater than that of the conductive pattern 110 and electrically contacts the conductive pattern 110.

When the lead part 230 contacts the conductive pattern 110, both ends or the entire surface of the lead part 230 contacts both ends of a predetermined section of the conductive pattern 110.

When the lead part 230 contacts the conductive pattern 110, since the electrical conductivity of the lead part 230 is greater than that of the conductive pattern 110, the current having flown through the conductive pattern 110 flows through the lead part 230 from both ends of the predetermined contact section.

As such, the lead part 230 provides an alternative path through which charging/discharging current may pass, and thereby allows heat to be less generated than that generated when charge/discharge current flows through the conductive pattern 110.

In accordance with an exemplary embodiment, the first lead part 231 provides an alternative path which electrically contacts the conductive pattern, through which charging current flows, and provides an alternative path through which the charging current may flow, and the second lead part 232 provides an alternative path which electrically contacts the conductive pattern, through which discharging current flows, and provides an alternative path through which the discharging current may flow.

The FET 300 is mounted on the printed circuit board 100, functions to switch charging/discharging current when charging/discharging a battery, and includes a charging FET 310 for switching charging current and a discharging FET 320 for switching discharging current.

The FET 300 in accordance with the present disclosure has a lead formed in a right angle and is mounted such that the body of the FET 300 is horizontal to the printed circuit board 100.

Through this, in comparison with mounting the body of the FET 300 to be erected upright on the printed circuit board 100, the mounted height may be reduced, and thus, a battery pack may be allowed to be manufactured in a small size.

What is claimed is:

1. A printed circuit board having a heat dissipating system, comprising:
   a printed circuit board having a conductive pattern thereon;
   an electronic component mounted on the printed circuit board, wherein the conductive pattern provides a current path through which a current flows to the electronic component; and
   the heat dissipating system comprising a high-conductance heat-dissipating part and a lead part, wherein the lead part electrically contacts a predetermined section of the conductive pattern, the lead part formed of a material having a greater electrical conductivity than the conductive pattern,
   wherein the lead part provides an alternative current path such that the current flows through the lead part and not the predetermined section of the conductive pattern, and
   wherein the high-conductance heat-dissipating part dissipates heat generated due to current flowing through the conductive pattern and the lead part.

2. The printed circuit board of claim 1, wherein an entire or a predetermined section of the lead part contacts the conductive pattern.

3. The printed circuit board of claim 2, wherein the lead part contacts both ends of the predetermined section of the conductive pattern through which the current flows.

4. A battery charging/discharging circuit having a heat dissipating system, comprising:
   a battery charging/discharging circuit comprising a printed circuit board and a charging/discharging FET mounted on the printed circuit board, wherein the printed circuit board comprising a conductive pattern for providing a path through which a charging/discharging current flows; and
   the heat dissipating system comprising a high-conductance heat dissipating part and a lead part, the lead part electrically contacting a predetermined section of the conductive pattern,
   wherein the lead part is formed of a material having an electrical conductivity greater than that of the conductive pattern, wherein the lead part provides an alternative current path such that the charging/discharging current flows through the lead part and not the predetermined section of the conductive pattern, and
   wherein the high-conductance heat-dissipating part dissipates heat generated due to the charging/discharging current flowing through the conductive pattern and the lead part.

5. The battery charging/discharging circuit of claim 4, wherein
   both ends or an entire surface of the lead part contacts the predetermined section.

6. The battery charging/discharging circuit of claim 4, wherein the heat dissipating system comprises a body, the body having the high-conductance heat dissipating part disposed on a first surface of the body, and the lead part disposed on an opposing second surface of the body,
   wherein the lead part comprises a first lead part and a second lead part, and wherein the conductive pattern comprises a first conductive pattern and a second conductive pattern,
   wherein the first lead part electrically contacts the first conductive pattern through which a charging current of the charging/discharging current flows,
   wherein the second lead part electrically contacts the second conductive pattern through which a discharging current of the charging/discharging current flows, and
   wherein the first lead part and the second lead part are disposed on opposing sides of the second surface of the body and are facing each other.

7. The battery charging/discharging circuit of claim 4, wherein the charging/discharging FET has leads formed in right-angle shapes and is mounted such that a body of the charging/discharging FET is horizontal to the printed circuit board.

* * * * *